United States Patent [19]

Diepeveen

[11] 4,140,263
[45] Feb. 20, 1979

[54] METHOD FOR MOVING TOOL OR THE LIKE

[76] Inventor: John C. Diepeveen, 1737 Kimberly Dr., Sunnyvale, Calif. 94086

[21] Appl. No.: 808,484

[22] Filed: Jun. 20, 1977

Related U.S. Application Data

[60] Division of Ser. No. 669,056, Mar. 22, 1976, Pat. No. 4,066,200, which is a continuation of Ser. No. 537,523, Dec. 30, 1974, Pat. No. 4,019,668.

[51] Int. Cl.² .................................................. H01L 21/58
[52] U.S. Cl. ............................... 228/110; 228/180 A
[58] Field of Search ............ 29/740; 228/180 A, 6 A, 228/3.1, 110, 115; 214/1 BS, 1 BT

[56] References Cited

U.S. PATENT DOCUMENTS

| 3,451,607 | 6/1969 | Miller et al. | 228/1 |
| 3,479,716 | 11/1969 | Zanger et al. | 29/740 |
| 3,575,333 | 4/1971 | Kvlicke et al. | 228/180 A |

Primary Examiner—James L. Jones, Jr.
Assistant Examiner—K. J. Ramsey
Attorney, Agent, or Firm—Townsend and Townsend

[57] ABSTRACT

A mechanism having first means for moving a tool or the like in an up and down direction and second means for moving such device in a fore and aft direction. The mechanism is suitable for a number of different uses and is especially adapted for die bonding operations wherein a die is picked up at one location and transferred to a second location. The mechanism also has means for imparting reciprocatory motion to the device so that, if the device is a die placement tool, the tool can be utilized to provide a scrubbing action for the die on a substrate therebelow.

1 Claim, 14 Drawing Figures

METHOD FOR MOVING TOOL OR THE LIKE

This is a division of application Ser. No. 669,056, filed Mar. 22, 1976 and now U.S. Pat. No. 4,066,200 which latter application is a continuation of application Ser. No. 537,523 filed Dec. 30, 1974, now U.S. Pat. No. 4,019,668.

This invention relates to improvements in transfer mechanisms of the type which can move a tool or other device from one position to another so that functions of different types can be performed at two or more operative locations.

BACKGROUND OF THE INVENTION

While the present invention is suitable for a number of different applications, it is especially suited for use in bonding semiconductor dies or chips to a substrate. Such chips are extremely small in size and are of the order of 10 to 15 mils. on a side. Thus, the mechanism for moving and controlling a tool for picking up and transfering such a die must be constructed to minimize the tolerance to a figure below about 2 to 3 mils. when operating with a die of the type described. This, therefore, requires that the number of junctions between two relatively moving parts must be minimized and also the number of pivot points in such a mechanism must be reduced to a bear minimum. Otherwise, errors at each pivot point or each junction between two relatively moving parts will have accumulative effect, thereby increasing errors and maximizing the tolerance rather than minimizing the same. A typical die handling apparatus having a relatively large number of pivot points is disclosed in U.S. Pat. No. 3,695,501. Because of the foregoing criteria, a need has arisen for an improved mechanism suitable for a die bonding operation.

SUMMARY OF THE INVENTION

The present invention is directed to a mechanism adapted for a number of uses including use with a die pickup and transfer tool as a die bonding mechanism. The invention is constructed of a number of parts which assures rectilinear up and down and fore and aft movements of a tool or other device to minimize pivot points between relatively shiftable parts and thereby to minimize the tolerance of the mechanism, thereby rendering it especially suitable for picking up and transfering semiconductor dies or chips or extremely small size. To this end, the mechanism includes a vertically movable slide plate having means projecting laterally therefrom on which a tool or other device can be mounted. Thus, when the slide plate moves up and down, the device also moves with it in a vertical plane. Also, the slide plate will permit the tool or other device to move fore and aft with respect thereto. This feature allows, for instance, a die pickup tool to move up and down with respect to a first die supporting surface to allow pick-up of a die, then horizontally to a position above a second die supporting surface, whereupon the die can be lowered to the second surface when the slide plate moves downwardly. Since the tool or the device can be operated by a suction force, control of the pickup, transfer and deposit of a semiconductor die or the like can be effected easily.

Another feature of the mechanism of the present invention is that is has a portion thereon which will cause the mounts for the tool or other device to be reciprocated through a small distance when the device is in one of two different operative positions. This portion thereby provides a scrubbing motion to the device which is especially important when it is desired to provide a eutectic bond between the die and a substrate therebelow. The stroke or distance of the reciprocal motion of the device can be adjusted as desired depending upon the size of the die or the amount of surface area to be scrubbed. Also, the time of the reciprocatory motion or the number of cycles thereof can be adjusted by suitable timing means.

The primary object of this invention is to provide an improved mechanism for a wide variety of uses wherein the mechanism includes straight-line up and down movements as well as fore and aft straight-line movements, all of which is done with a minimum of parts to minimize tolerance errors and to thereby render the mechanism suitable for a die bonding operation.

Another object of the present invention is to provide a die bonding apparatus and method wherein a semiconductor die can be picked up at one location, moved along a straight-line path and then downwardly to a second location, all of which is done with a minimum of parts and with a minimum of connection between such parts to minimize tolerance errors and to assure that semiconductor dies can be readily handled and controlled at all times.

Still another object of this invention is to provide a die bonding apparatus and method of the type described wherein, in addition to the straight-line up and down and fore and aft movements of a die, scrubbing movements of the die can be effected to provide for eutectic bonding of the die to a substrate, notwithstanding the minimal tolerance errors which render the apparatus and method suitable for use with such dies.

Other objects of this invention will become apparent as the following specification progresses, reference being had to the accompanying drawings for an illustration of the invention.

The transfer and placement mechanism of this invention is broadly denoted by the numeral 10 and, for purposes of illustration, will be described hereinafter as forming the basis of a die bonding apparatus and method. Mechanism 10 includes a base plate 12 having a pick-up and transfer unit 14 (FIGS. 1 and 3-5), power drive means 16 (FIG. 1), and linkage means 18 (FIGS. 1 and 4) for coupling pickup and transfer unit 14 with power drive means 16.

As used in die bonding operations, mechanism 10 operates to engage and pick up a die initially at a first location, such as on a horizontal flat surface, then to transfer the die along a generally rectilinear path to a position above a second location, such as die frame having a pad resting on a heater block, then to lower the die onto the pad of the die frame, following which, if there is a gold-silicon interface between the pad and the die, the die is reciprocated while it engages the pad to scrub the latter to assure a proper bond between the die and the pad. No scrubbing action occurs if there is no gold-silicon interface involved. Following this, the die is released and the various parts of mechanism 10 return to their initial starting positions so that the next die bonding operation can commence and continue in accordance with the foregoing sequence. The various parts of mechanism 10 which permit it to carry out the foregoing functions will be described in detail hereinafter.

Transfer and pick-up unit 14 includes a pick-up tool 20 (FIGS. 1, 3 and 4) coupled in any suitable manner to a tool mount 22 rigidly secured on the outer or front end of a first, rigid tubular member 24 telescopically received within a second, rigid tubular member 26 rigidly secured at its opposite or rear end to a block 28 (FIGS. 1 and 2) at the normally front face 29 thereof. Block 28 is disposed within a recess 30 of a generally triangular, plate-like slide element 32 (FIGS. 1 and 2) and is pivotally coupled thereto by means of a horizontal pin 34 extending through slide element 32 and through recess 30 and emerging at opposite sides of slide element 32. Bearings 38 (FIG. 2) journal pin 34 for rotation relative to slide element 32. A pair of collars 40 are releasably attached to the outer ends of pin 34 to prevent any substantial axial movement of pin 34 relative to slide element 32.

Figure 1:
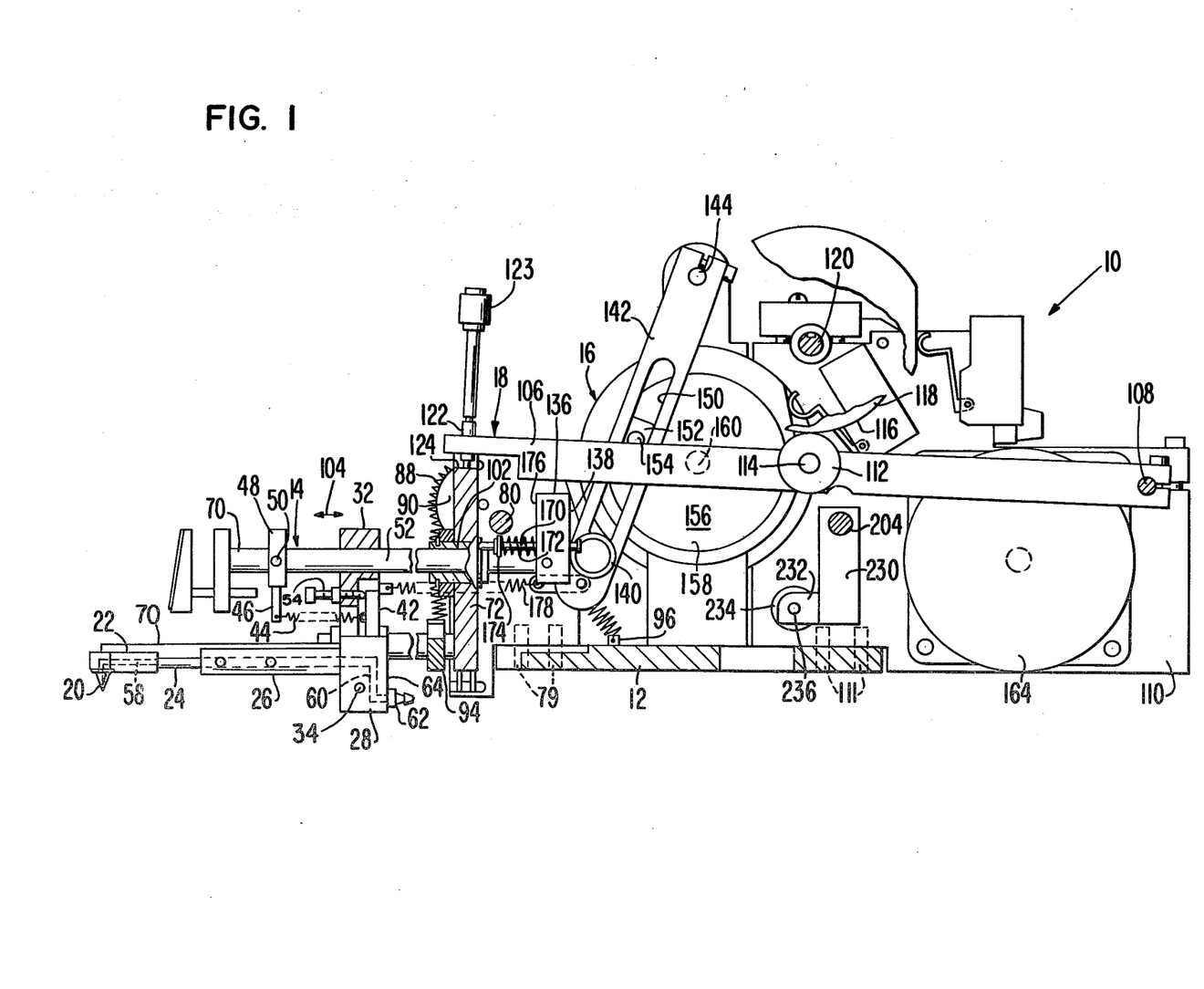
FIG. 1 is a first vertical section through the mechanism, showing the tool, tool mount and vertical slide plate, and means for reciprocating the slide plate and the tool mount.

A stud shaft 42 (FIGS. 1, 2 and 4) is rigid to the upper margin of block 28 and projects upwardly therefrom. Shaft 42 has a spring 44 (FIGS. 1, 2 and 4) coupled at one end therewith, the spring extending forwardly of shaft 42 and being connected at its opposite or forward end to a pin 46 projecting outwardly and downwardly from a collar 48 rigidly and adjustably secured by a set screw 50 (FIG. 1) to a shaft 52 which is generally parallel with and above tubular members 24 and 26 and is rigidly and releasably secured to and extends through the upper end of slide element 32. Spring 44 is normally stretched so that block 28 is biased in a counterclockwise sense when viewing FIG. 1. A screw 54 (FIG. 1) extends through slide element 32 and the rear end of the screw normally abuts the upper end of stub shaft 42. Thus, the angular position of block 28 and thereby pickup tool 20 relative to a horizontal reference line 56 (FIG. 1) can be adjusted. As shown in FIG. 1, tubular members 24 and 26 are slightly inclined relative to reference line 56.

Tool 20 operates to pick up an article, such as a semiconductor die, by a vacuum or suction force. To this end, tool 20 has a fluid passage (not shown) therethrough and tool mount 22 has a fluid passage 58 (FIG. 1) therethrough for communicating with the corresponding passage in tool 20. Passage 58 communicates with the interior of tubular members 24 and 26. Block 28 has an L-shaped passage 60 (FIG. 1) therein which communicates with a fitting 62 projecting from the rear face 64 of block 28 so that a flexible hose can be connected to the fitting and thereby be placed in fluid communication with the tool. The hose extends to and is coupled with a vacuum source (not shown).

Figure 3:
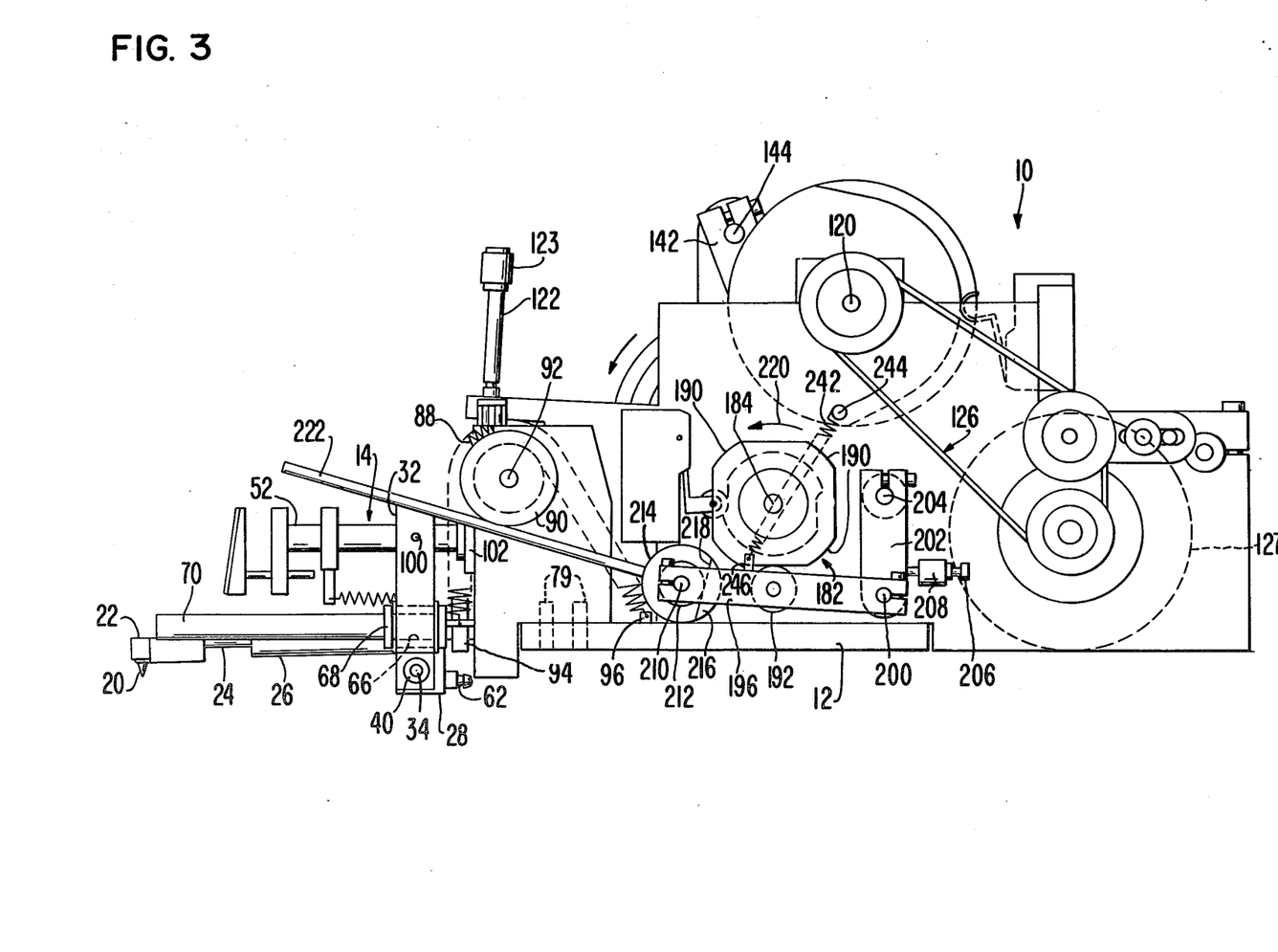
FIG. 3 is an elevational view of one side of the mechanism, showing the scrubbing mechanism therefor.
Figure 4:
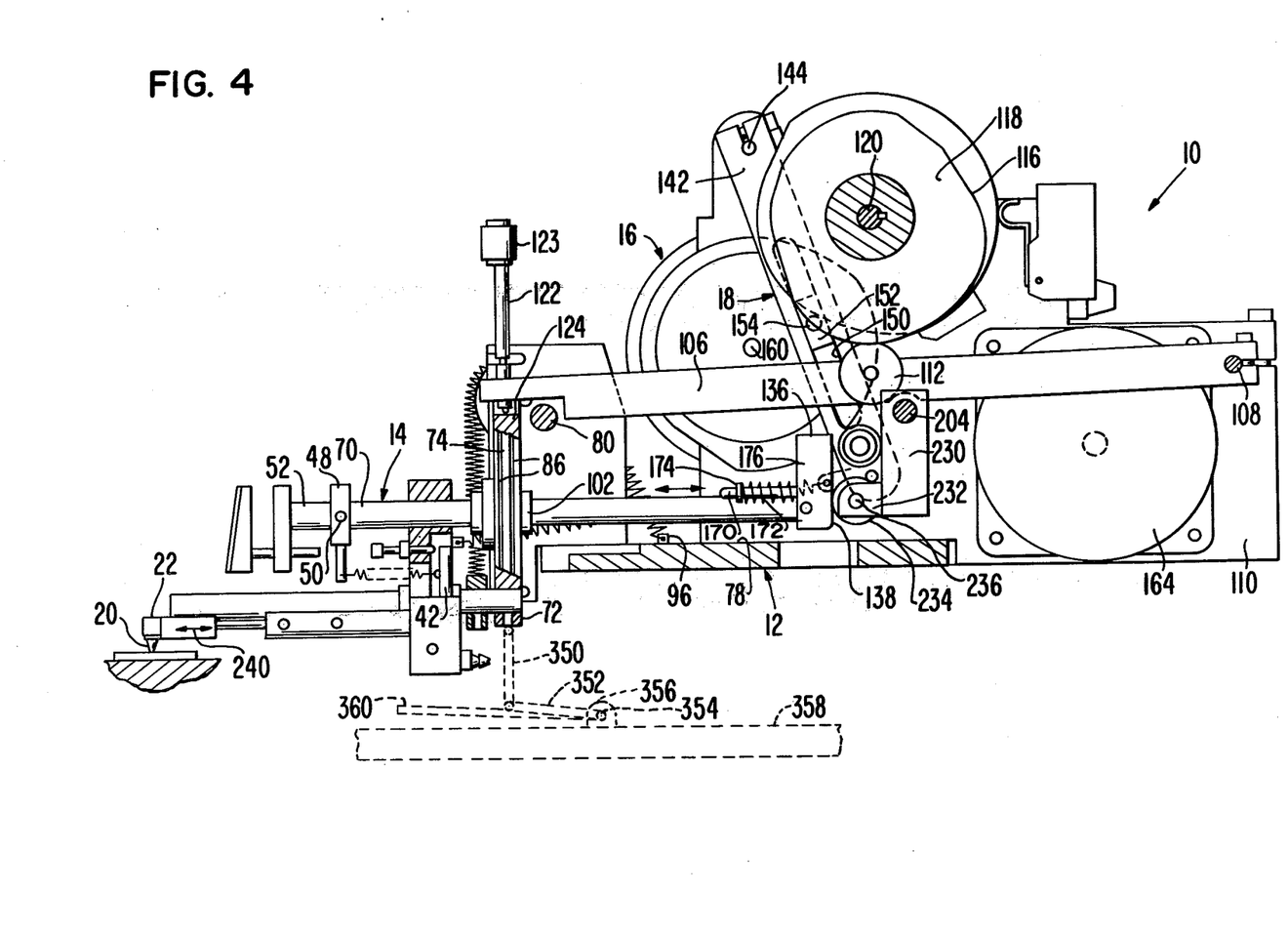
FIG. 4 is a view similar to FIG. 1 but showing certain parts in different operative positions.

Slide element 32 has a pair of holes 66 (FIGS. 3 and 5) therethrough on opposite sides of recess 30. A bearing 68 (FIGS. 2, 3 and 5) is disposed in each hole 66, respectively. Bearings 68 are slidably mounted on a pair of generally parallel, stationary, horizontal rods 70 (FIGS. 1, 2 and 5) whose rear ends are rigidly secured to a vertical slide plate 72 (FIGS. 1, 2, 4 and 5) which is slidably mounted by suitable bearings 74 on a pair of parallel side plates 76 (FIGS. 2 and 4) rigidly secured to and extending upwardly from the upper surface 78 of base plate 12 as shown in FIG. 4. Machine screws 79 (FIGS. 1 and 3) secure side plates 76 to base plate 12. A cross brace 80 (FIGS. 1 and 4) interconnects side plates 76 to rigidify the same.

For purposes of illustration, each bearing 74 can comprise a race 82 (FIG. 2) having balls 84 at spaced holes therethrough, the balls being carried by spaced rods 86 (FIG. 4) secured, respectively, to side plates 76 and slide plate 72. Thus, bearings 74 allow slide plate 72 to move up and down relative to side plates 76. Other bearing means can be provided, if desired.

The purpose of slide plate 72 is to move tool 20 up and down in accordance with a predetermined sequence hereinafter described. As shown in FIG. 1, slide plate 72 is in its normally uppermost position. It is biased into such uppermost position by a pair of coil springs 88 (FIGS. 2, 3 and 8) which pass over respective pulleys 90 journalled on pins 92 rigid to respective side plates 76. One end of each spring 88 is secured to the corresponding end of a horizontal crosspiece 94 (FIG. 2) rigid to and spanning the distance between and laterally beyond rods 70 in front of slide plate 72 and spaced therefrom. The opposite end of each spring 88 is coupled by a projection 96 (FIGS. 1, 3 and 4) to the upper surface 78 of plate 12. Springs 88 are normally stretched so that a generally continuous bias force is exerted upwardly on crosspiece 94 and thereby rods 70 and slide plate 72 since the crosspiece is rigidly carried to rods 70 which, in turn, are rigid to the lower extremity of the slide plate. Since rods 70 are biased upwardly by springs 88, tool mount 22 and tool 20 are so biased as well.

Slide element 32 is rigidly coupled by set screws 100 to horizontal shaft 52 and the latter is slidably mounted by a bearing 102 (FIGS. 1 and 4) extending through slide plate 72 so that shaft 52 can reciprocate in the direction of arrows 104 (FIG. 1) relative to the slide plate. In so doing, shaft 52 moves slide element 32 back and forward relative to and along rods 70. Thus, tool 20 is shifted horizontally back and forth with respect to slide plate 72.

Slide plate 72 is shifted downwardly by the downward pivotal movement of a lever 106 (FIGS. 1 and 4) about a horizontal shaft 108 journalled at its ends by suitable bearings (not shown) to a pair of spaced sidewalls 110 (FIGS. 1, 4 and 5) parallel with side plates 76 and rigidly secured by machine screws 111 (FIG. 1).

Lever 106 carries an idler roller 112 (FIGS. 1 and 4) intermediate its ends, the roller being mounted for rotation on a pin 114 rigid to and extending laterally from lever 106. Roller 112 engages the outer cam edge 116 of a cam 118 rigidly mounted on a shaft 120 (FIGS. 1, 4 and 5) spanning the distance between and journalled for rotation on sidewalls 110. As cam 118 rotates under the influence of shaft 120, lever 106 is caused to move in a counterclockwise sense when viewing FIG. 1 and forces slide plate 72 downwardly. To this end, an adjustable, threaded rod 122 having a head 123 is carried at the forward end of lever 106 and bears at its lower end upon a flat upper surface 124 formed by a notch 125 (FIG. 2) in the upper margin of slide plate 72. Rod 122 permits adjustment of the position of slide plate 72 relative to side plates 76 and thereby adjusts the position of tool 20 above a reference plane therebelow.

A drive motor 127 (FIG. 5) is provided to rotate shaft 120 and thereby reciprocate lever 106 up and down. To this end, motor 127 is coupled by a belt and pulley assembly 126 (FIGS. 2, 3 and 5) to shaft 120 to rotate the same and thereby cause downward movement of slide plate 72 from an initial, fully up position. The bias forces of springs 88 return slide plate 72 to its initial position after cam 118 has been rotated through a single revolution since lever 106 has no spring bias force directly exerted thereon. Thus, a motor 127 operates to cause a single revolution of shaft 120, slide plate 72 and thereby tool 20 move downwardly from their initial upper operative positions to respective lower operative positions and then are returned to their upper operative positions.

Figure 2:
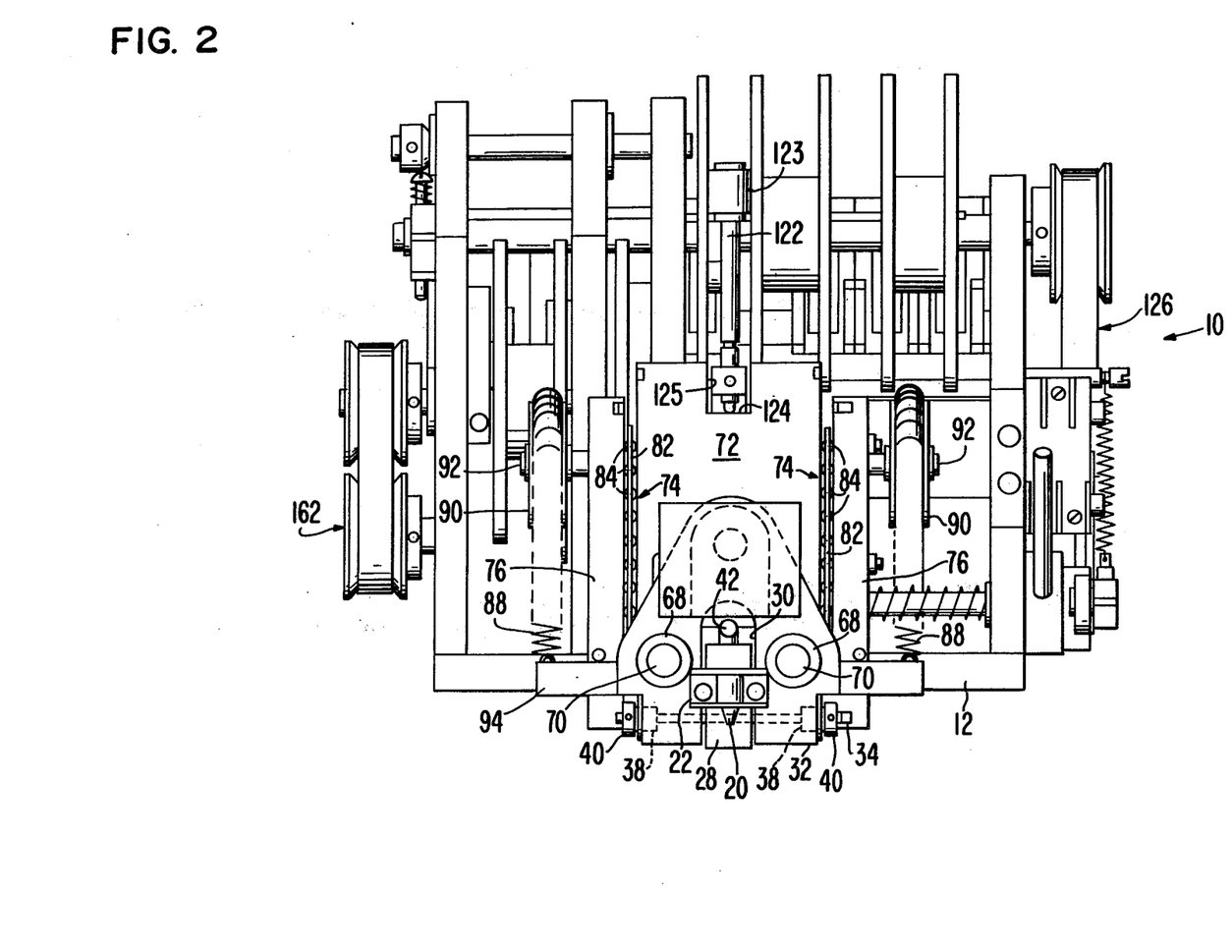
FIG. 2 is a front elevational view of the mechanism.
Figure 5:
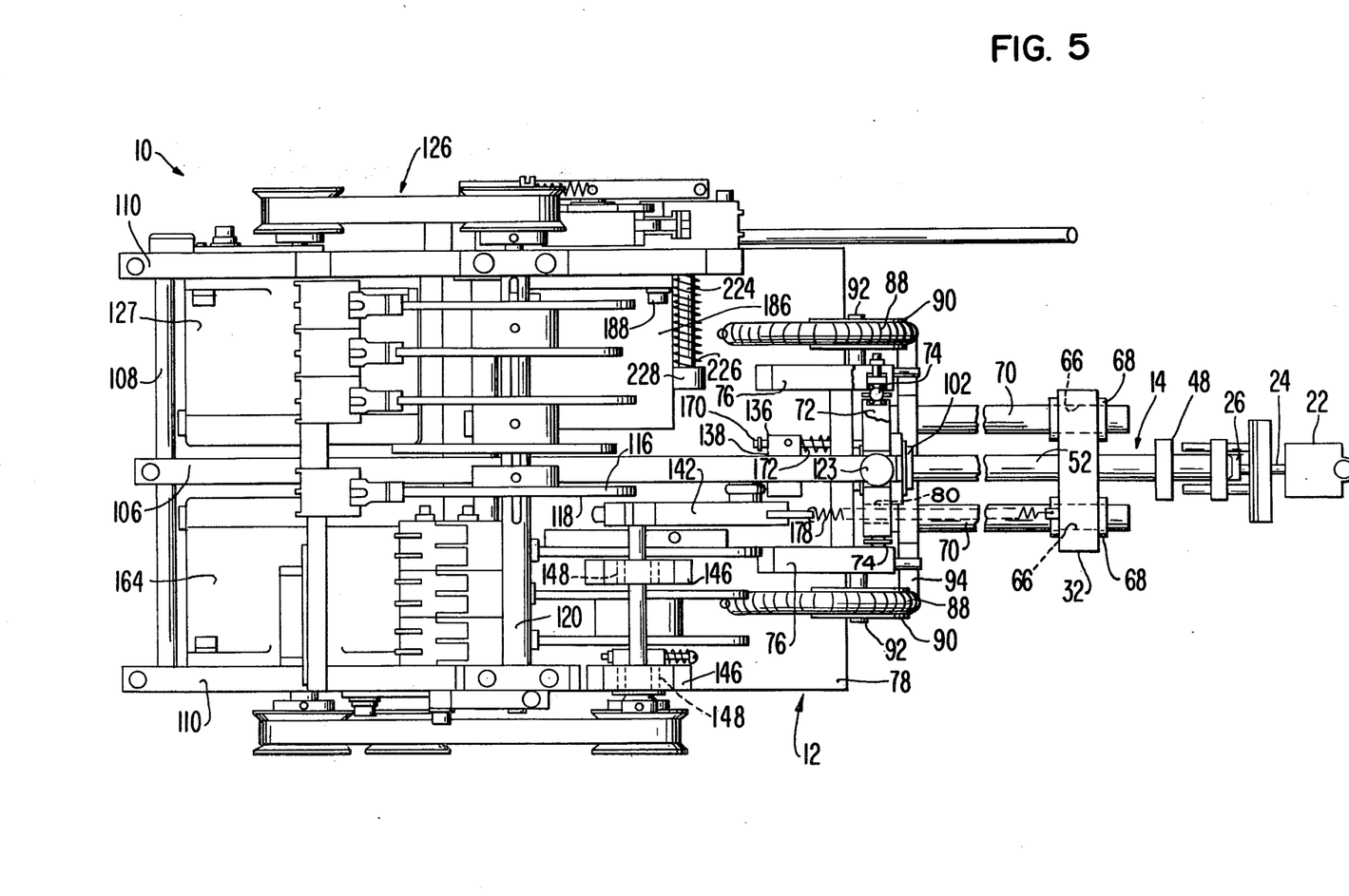
FIG. 5 is a top plan view of the mechanism.

To cause fore and aft horizontal movement of shaft 52 and thereby tool 20, a slotted lever 142 is provided, lever 142 being pivotally mounted by a horizontal shaft 144 journalled by bearing 148 (FIG. 5) on the upper ends of a pair of plate-like extensions 146 secured to and extending upwardly from base plate 12 (FIGS. 2 and 5). The rear end of shaft 52 has a rigid, upright block 136 (FIGS. 1, 4 and 5) thereon whose rear, flat, vertical face 138 is engaged by a roller 140 journalled on the lower end of slotted lever 142 on a pair of upright extensions 146 forming part of the corresponding sidewall 110.

Figure 6:
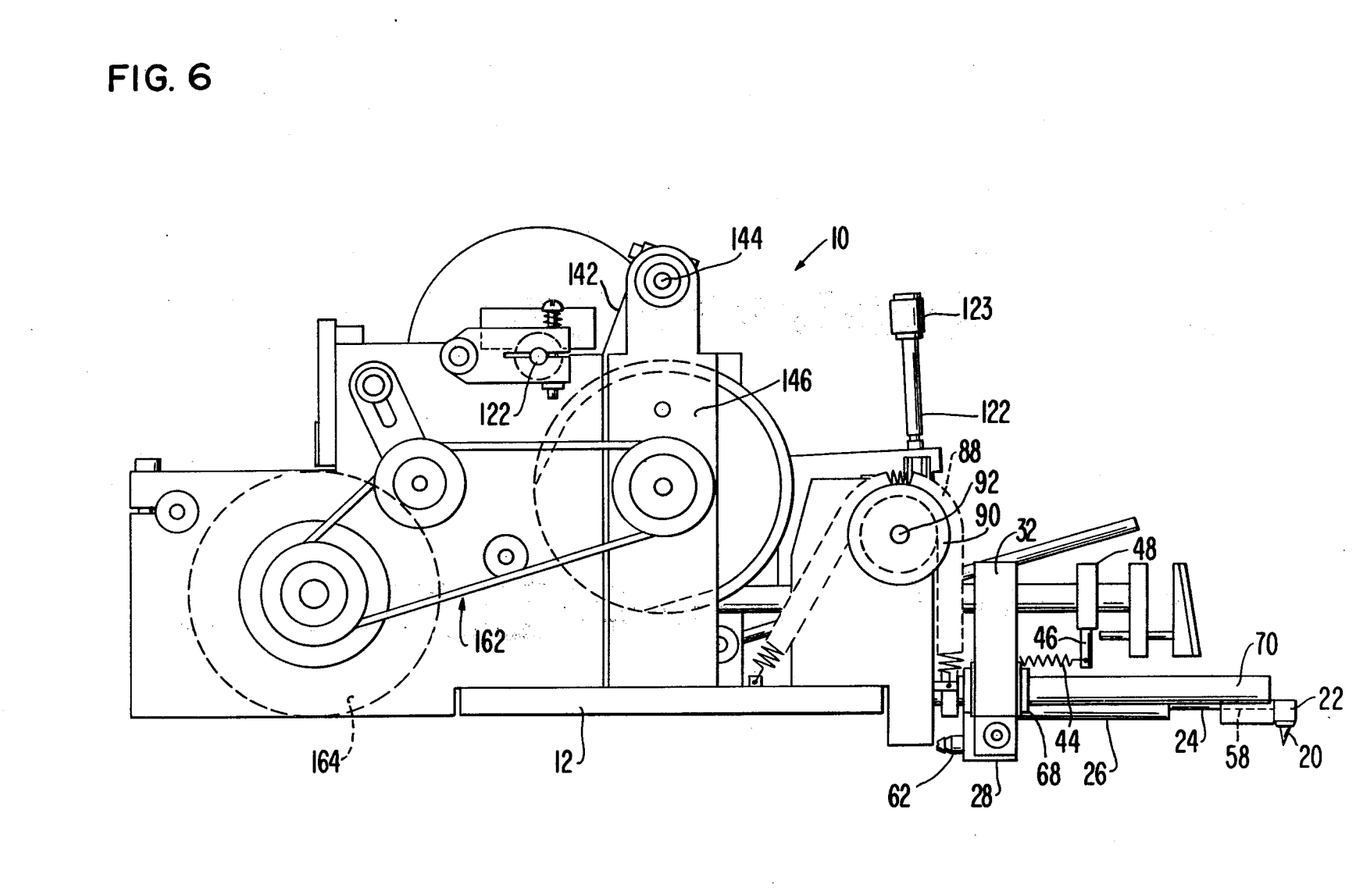
FIG. 6 is an elevational view of the opposite side of the mechanism.

Lever 142 has a central slot 150 therethrough for receiving a slide follower 152 (FIGS. 1 and 4) secured by a pin 154 to one side face 156 (FIG. 1) of a rotatable member 158 rigid to a shaft 160 passing through extensions 146. A belt and pulley assembly 162 (FIGS. 2, 5 and 6) is coupled to shaft 160 for rotating the same under the influence of a drive motor 164 carried in any suitable manner to the adjacent sidewall 110. Slide follower 152 is complemental to slot 150 and is pivotal relative to rotatable member 158; thus, slide follower 152 moves up and down in slot 150 and pivots relative thereto as lever 142 swings about the axis of pin 144 under the influence of drive motor 164.

Block 136 on the rear end of shaft 52 has a plunger 170 (FIGS. 1, 4 and 5) shiftably mounted therethrough, there being a coil spring 172 surrounding plunger 170 and spanning the distance between a retainer ring 174 and the front face 176 of block 136. As shaft 52 returns to its forwardmost position as shown in FIG. 1, the front end of plunger 170 engages the rear face of slide plate 72, thereby urging block 136 rearwardly and tending to bias lever 142 in a counterclockwise sense about pin 144 (FIG. 1). This compensates for wear on slide follower 152 and accurately positions tool 20 with respect to a reference plane therebelow, such as a die supporting surface. Also, a coil spring 178 (FIGS. 1 and 5) is connected at its ends to the rear face of slide element 32 and to the lower end of lever 142 to bias the latter forwardly. Spring 178 extends through an opening 180 (FIG. 5) in slide plate 72. Slide element 32 and thereby tool 20 are pulled to the right (viewing FIG. 1) by spring 178 as lever 142 rotates in a clockwise sense (FIG. 1). Since spring 178 is normally stretched, it biases follower against lever 142 at one side of slot 150 to compensate for wear of the follower.

When shaft 52 and thereby tool 20 are in their rearmost positions (FIG. 3), tool 20 can be given a scrubbing motion, that is, a motion fore and aft through an adjustable, relatively short distance. This is accomplished by the use of a cam 182 (FIG. 3) rigidly secured to a shaft 184 of a drive motor 186 rigidly secured to the adjacent sidewall 110 by screws 188 (FIG. 5). Cam 182 has a number of lobes 190, for example, four lobes in FIG. 3, on its outer periphery which are adapted to successively move over the outer periphery of a roller 192 carried by a pin 194 on a lever 196 intermediate its ends, lever 196 having its rear end 198 journalled on a pin 200 carried at the lower end of an arm 202 rigidly secured to the proximal end of a shaft 204 spanning the distance between and journalled on sidewalls 110. An adjustable screw stop 206 mounted on a block 208 rigid to the proximal sidewall 110 abuts the rear faces of arm 202 and limits its pivotal movement in a counterclockwise sense when viewing FIG. 3.

Lever 196 has a pin 210 on its front end on which is journalled a roller 212 engageable with a disk-like member 214 having a crescent-shaped projection 216 defining a flat bearing surface 218 perpendicular to the outer flat face of member 214. Roller 212 is engageable with surface 218 and can move along the same and thereby rock arm 202 about the axis of shaft 204 when surface 218 is slightly inclined as shown in FIG. 3 and as cam 182 rotates under the influence of motor 186 in the direction of arrow 220 (FIG. 3). The inclination of surface 218 can be changed by rotating member 214 about its central axis to vary the stroke or displacement of arm 202. This is accomplished by manually rotating rod 222 rigid to and extending forwardly from the outer periphery of member 214.

Member 214 has a shaft 224 (FIG. 5) which passes through the corresponding sidewall 110. A coil spring 226 surrounds shaft 224 on the side opposite to member 214 and extends between a collar 228 and the proximal surface of the corresponding sidewall 110 so that member 214 effectively frictionally engages the opposite face of sidewall 110. This assures that member 214 frictionally stays in one position yet it can be moved by rod 222 if desired to change the inclination of crescent flat surface 218.

The reciprocal movement of arm 202 is transmitted to a second arm 230 (FIG. 4) rigid to and extending downwardly from shaft 204. The lower end of arm 230 has a foot 232 provided with a roller 234 journalled thereon by a pin 236. Roller 234 engages the flat rear face 138 of block 136 when shaft 52 and thereby tool 20 are in their rearmost positions as shown in FIGS. 3 and 4. Thus, the downward movements of roller 212 along surface 218 when the latter is inclined and as cam 182 rotates is transmitted as fore and aft movements of lever 196, pivotal movements of arm 202 and arm 230 in respective vertical planes, and fore and aft movements of block 136, resulting in corresponding fore and aft movements of tool 20 in the opposed directions of double arrow 240 (FIG. 4). These movements provide a scrubbing movement of the tool when the latter carries a die so that the die will scrub the surface of the substrate therebelow and thereby be thereafter properly bonded thereto.

Typically, motor 186 (FIG. 5) will be pulsed so that cam 182 rotates a number of times in the direction of arrow 220 (FIG. 3). This causes a number of fore and aft scrubbing strokes of tool 20, such as six or more, whichever is considered desirable or necessary to effect the necessary bond.

A coil spring 242 biases lever 196 in a clockwise sense when viewing FIG. 3 about pin 200. One end of spring 242 is coupled to a pin 244 rigid to lever 196 and the other end of spring 242 is connected to a pin 246 projecting laterally from the adjacent sidewall 110.

Figure 6A:
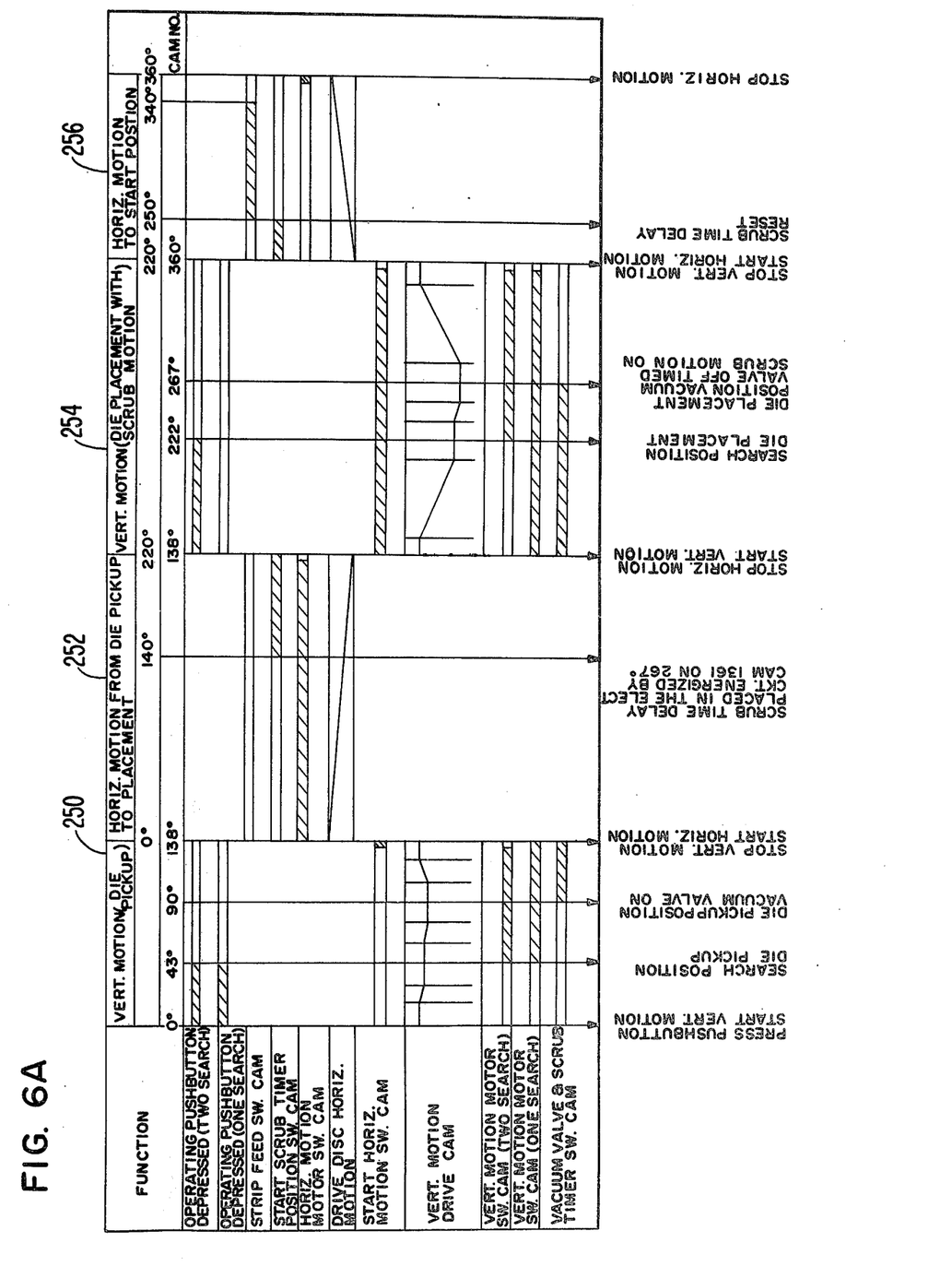
FIG. 6A is a timing chart showing sequential operation of various parts of the mechanism.

The system includes additional cams on shaft 120 for engaging respective switches used for control purposes. Thus, such switches are actuated as a function of the rotation of shaft 120. Similarly, additional cams are provided on shaft 144 and these cams also engage respective switches for control purposes. Finally, cam 182 has a switch associated with it and this switch engages a cam rigid to shaft 184. FIG. 6A shows a timing chart of the various functions of mechanism 10. It is divided into four sections, namely, section 250 relating to vertical motion of tool 20 for die-pickup operations, section 252 relating to horizontal movement from the die-pickup location to the die-placement location, section 254 relating to vertical motion to die-placement location followed by scrubbing action, and section 256 relating to the return of the tool to its starting position.

OPERATION

Figure 7:
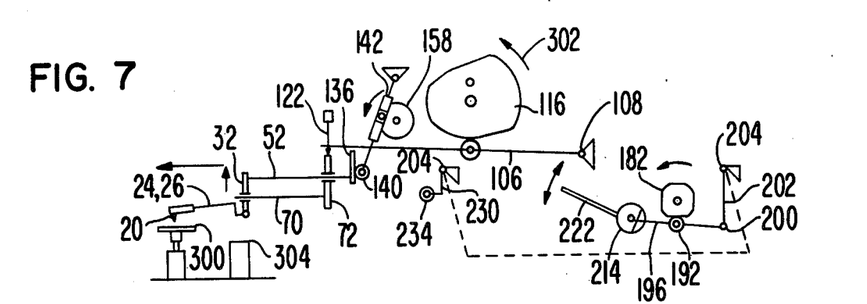
FIGS. 7-13 are schematic views of the mechanism, showing the way in which the tool picks up a die at one surface, transfers the die to a second surface and then causes the die to effect a scrubbing action at the second surface.

Operation of mechanism 10 when used as a die handling apparatus is illustrated in FIGS. 7-13. FIG. 7 shows a tool 20 in its initial operating position spaced above a first die supporting surface 300. This is a mirror surface on which a plurality of semiconductor dies or chips can be supported. The dies can be viewed through a microscope (not shown) forming a part of the overall die handling apparatus.

The operation is commenced by causing tool 20 to be lowered over and onto a die so that the die can be picked up by a suction force applied to fitting 62 (FIG. 1).

Figure 8:
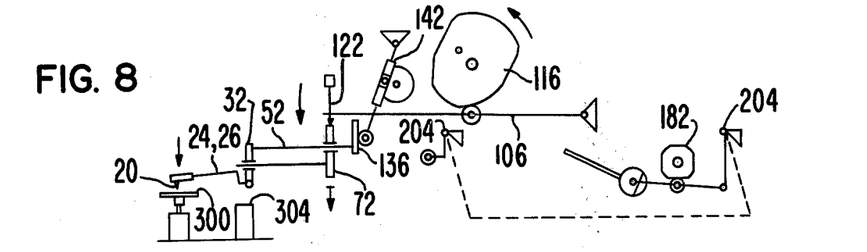
Figure 9:
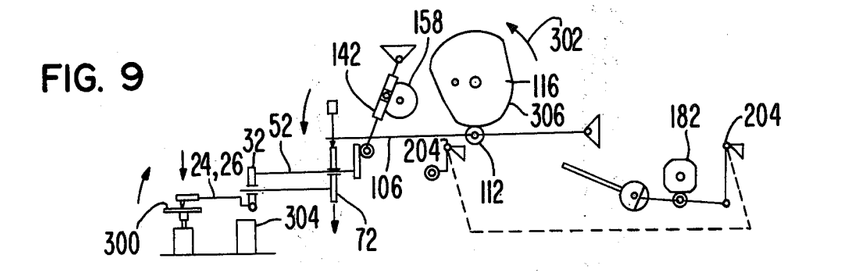

Tool 20 is lowered along with slide plate 72 and slide element 32 when cam 118 rotates in the direction of arrow 302, causing lever 106 to pivot in a counterclockwise sense about shaft 108, thereby forcing slide plate 72 straight downwardly along a vertical, rectilinear path. When slide plate 72 moves downwardly, slide element 32 also moves downwardly until tool 20 engages a die on support surface 300. When this occurs, members 24 and 26 become horizontal as shown in FIG. 9. This is an important feature when tool 20 has deposited a die on a second die supporting surface 304 because, upon initial upward movement of slide element 32 after the deposit of a die on surface 304, members 24 and 26 again assume an inclined orientation as shown in FIGS. 7 and 8 while the front portion of tool 20 continues to engage the die. This means that the rear end of the tool becomes disengaged from the die before the front end of the tool does, thereby assuring that any surface tension between the die and the tool will be broken before the tool moves totally away from the die itself. This will not only prevent damage to the die but will assure that there will be no interference with the bond between the die and surface 304 therebelow.

Figure 10:
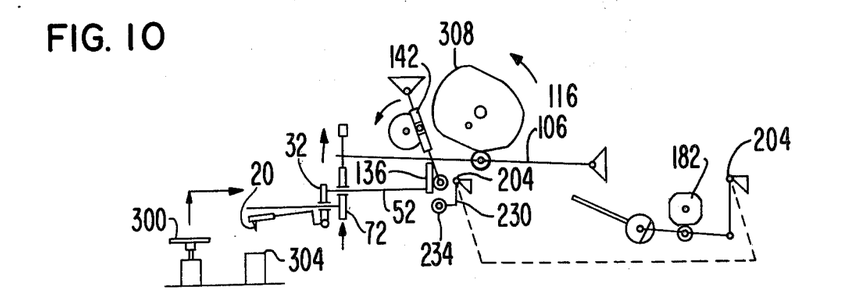
Figure 11:
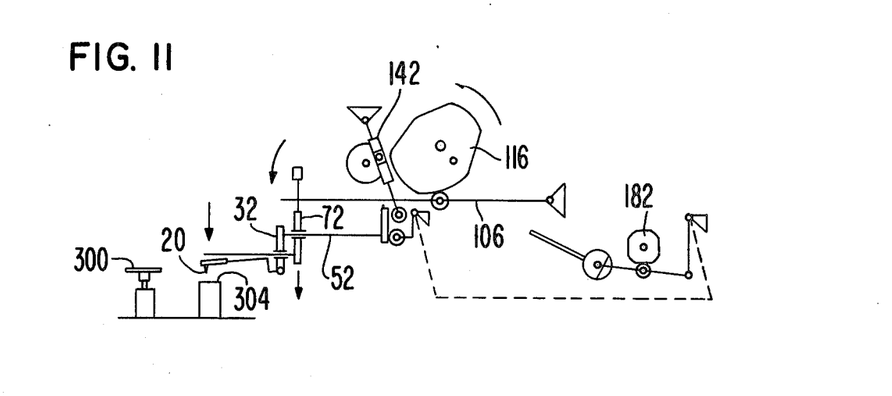
Figure 12:
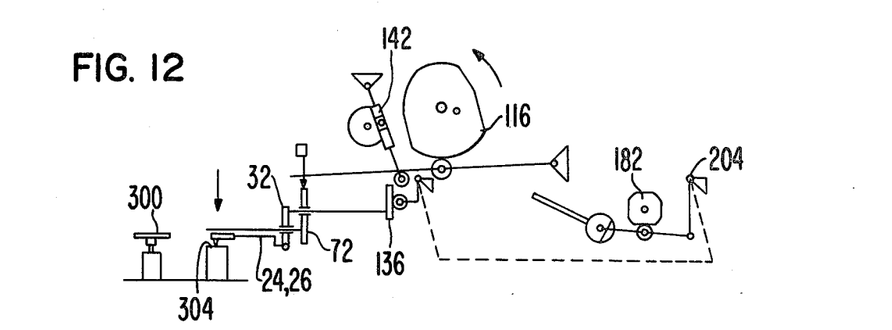

As shown in FIGS. 7-9, lever 142 remains in its forward position during vertical downward movement of the die, with respect to surface 300. As cam 116 continues to rotate in the direction of arrow 302 so that lobe 306 thereof passes roller 112 on lever 106, rotatable member 158 commences to rotate and lever 142 moves to the position shown in FIG. 10. During this time, shaft 52 moves to the right when viewing FIGS. 9 and 10 and carries tool 20 and slide element 32 with it. The movement of the tool continues until it is above surface 304 as shown in FIG. 10. At this time, slide plate 72 is in its normal uppermost position and block 136 is above roller 234 on arm 230. Then continued rotation of cam 118 causes the second lobe 308 thereof to lower slide plate 72 and thereby block 136 until the rear face of block 136 engages roller 234 as shown in FIG. 11. At the same time, tool 20 is lowered toward surface 304 so as to deposit the die carried by the tool on surface 304. It is noted in FIG. 12 that members 24 and 26 become horizontal when the die is deposited on surface 304.

Figure 13:
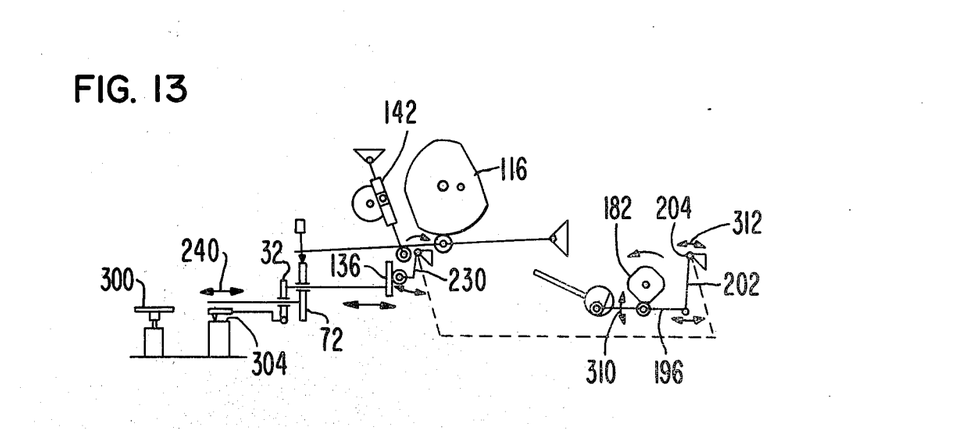

FIG. 13 illustrates that, with the die in contact with the substrate or surface 304, tool 20 is caused to move through a finite distance back and forth as denoted by double arrow 240 (FIGS. 4 and 13). This movement is caused by fore and aft movements of block 136 under the influence of cam 182 which causes pivotal movement of lever 196 along an arcuate path denoted by double curved arrow 310 (FIG. 13). This pivotal movement is accompanied by pivotal movement of arm 202 about the axis of shaft 204, causing the latter to pivot back and forth as denoted by double arrow 312 to in turn effect pivotal movement of arm 230.

At the end of the scrubbing action, the motor coupled with shaft 184 will be deenergized and cam 118 will be rotated so that slide plate 72 will be elevated to the position shown in FIG. 7. Then, rotatable member 158 will complete a single revolution, causing lever 142 to assume the position of FIG. 7 and thereby the various parts, including tool 20, will be in positions ready for the next die pickup and transfer cycle. All of the foregoing parts are controlled by an operator handling a start switch and the start switch can be operated so that the various movements of tool 20 can either be automatic or programmed for intermittent movements.

The foregoing description has been directed to the use of mechanism 10 as being automatic in up and down and fore and aft movements of the tool or similar device. If automatic operation is not desired but only fore and aft, semiautomatic operation, movement is desired, mechanism 10 can be used without the need of lever 106 and cam 118 for pivoting the same in a vertical plane. In such a case, slide plate 72 can be manually moved up and down by the operator of the mechanism and this can be done in any number of ways, one of which is shown in FIG. 4, wherein a first link 350 pivotally coupled to the lower end of slide plate 72 is coupled to an arm 352 which, in turn, is coupled to a shaft 354 extending horizontally to one side. The shaft can be mounted by bearing means 356 on a flat surface 358 and provided with a handle 360 on the end remote from the end to which arm 352 is connected. Thus, by manually moving handle 360 downwardly, slide plate 72 can be urged downwardly so that tool 20 can be moved toward a die supporting surface.

I claim:

1. A method of handling a semiconductor die comprising: moving a die pickup and transfer tool downwardly along a first vertical, rectilinear path until the tool is in proximity with the die to adhere to the tool; lifting the tool and the die and transferring the same transversely of said first path to a position above a surface; moving the tool and die downwardly along a second vertical, rectilinear path until the die engages the surface; reciprocating the tool and the die along the surface when the die engages the surface and as the suction force continues to be applied to the die; removing the suction force from the die; tilting the tool relative to the die after the suction force has been removed from the die; and lifting the tool away from the die after the tool has been tilted.

* * * * *